United States Patent
Sing et al.

(10) Patent No.: US 7,274,318 B2
(45) Date of Patent: Sep. 25, 2007

(54) CONTROL MODULE, RELATED CONTROL CHIP AND IDENTIFYING METHOD THEREOF

(75) Inventors: I-Ming Sing, Taipei (TW); Yi-Lin Lai, Taipei (TW)

(73) Assignee: Via Technologies, Inc., Taipei (TW)

( * ) Notice: Subject to any disclaimer, the term of this patent is extended or adjusted under 35 U.S.C. 154(b) by 0 days.

(21) Appl. No.: 11/420,111

(22) Filed: May 24, 2006

(65) Prior Publication Data
US 2007/0090982 A1    Apr. 26, 2007

(30) Foreign Application Priority Data
Oct. 20, 2005    (TW) .............................. 94136680 A

(51) Int. Cl.
H03M 1/12    (2006.01)
(52) U.S. Cl. ...................... 341/155; 327/401; 341/114
(58) Field of Classification Search ................ 341/155, 341/165, 166, 141, 114; 363/21.18; 327/482, 327/401, 365, 368
See application file for complete search history.

(56) References Cited

U.S. PATENT DOCUMENTS

| 6,184,663 | B1 * | 2/2001 | Imai et al. | 323/274 |
| 7,095,270 | B2 * | 8/2006 | Liu | 327/540 |
| 2004/0165228 | A1 * | 8/2004 | Ueno | 358/483 |

* cited by examiner

*Primary Examiner*—Peguy JeanPierre
(74) *Attorney, Agent, or Firm*—Thomas, Kayden, Horstemeyer & Risley

(57) ABSTRACT

A control module includes a plurality of switching elements, a control chip, and an identification unit. The switching elements are connected to a power terminal through a corresponding resistor each, wherein the resistances of corresponding resistors or equivalent resistance of combination thereof are different. The switching elements generate an input current according to operating conditions thereof. The input current is sent to the control chip through an input/output terminal and is transformed to a digital value. The identification unit identifies the operating conditions of the switching elements according to a lookup table and the digital value, such that the control chip executes a corresponding logic operation.

16 Claims, 5 Drawing Sheets

| Voltage Value (Volt) | Digital Value |
|---|---|
| 0.6257 | 10000 |
| 0.7 | 10010 |
| 0.7929 | 10100 |
| 0.8866 | 10110 |
| 0.97796 | 11000 |
| 1.073 | 11010 |
| 1.167 | 11100 |
| 1.26 | 11110 |
| 1.5 | 00000 |
| 1.594 | 00010 |
| 1.657 | 00100 |
| 1.781 | 00110 |
| 1.874 | 01000 |
| 1.967 | 01010 |
| 2.061 | 01100 |
| 2.155 | 01110 |

| Digital Value | K1 | K2 | K3 | K4 | K5 |
|---|---|---|---|---|---|
| 10000 | ON | OFF | OFF | OFF | OFF |
| 10010 | ON | OFF | OFF | ON | OFF |
| 10100 | ON | OFF | ON | OFF | OFF |
| 10110 | ON | ON | ON | ON | OFF |
| 11000 | ON | ON | OFF | OFF | OFF |
| 11010 | ON | ON | OFF | ON | OFF |
| 11100 | ON | ON | ON | OFF | OFF |
| 11110 | ON | ON | ON | ON | OFF |
| 00000 | OFF | OFF | OFF | OFF | OFF |
| 00010 | OFF | OFF | OFF | ON | OFF |
| 00100 | OFF | OFF | ON | OFF | OFF |
| 00110 | OFF | ON | OFF | ON | OFF |
| 01000 | OFF | ON | OFF | OFF | OFF |
| 01010 | OFF | ON | OFF | ON | OFF |
| 01100 | OFF | ON | ON | OFF | OFF |
| 01110 | OFF | ON | ON | ON | OFF |

229

FIG. 4

CONTROL MODULE, RELATED CONTROL CHIP AND IDENTIFYING METHOD THEREOF

BACKGROUND OF THE INVENTION

1. Field of the Invention

The invention relates to identification of operating conditions of switching elements by a single terminal, and in particular to methods and devices for identification of operating conditions of switching elements by a single terminal utilized in control panels of consumer electronic devices.

2. Description of the Related Art

Due to advances in semiconductor technology, chip design has become more complex, with density of logic gates increases accordingly. Integration of function of multiple conventional chips into one chip, system on chip (SOC), cost is increased accordingly due to an increase in chip area. Moreover, inputs and outputs between modules become more complex. As input/output pins increase, costs of chip fabrication and package and complexity of further chip testing are increased.

FIG. 1 shows a conventional control panel 100. As shown, each switching element 12 is coupled to an input/output terminal (pin) 14 of the control chip 10. Accordingly, operating conditions of each switching elements is input to the control chip 10 through the corresponding input/output terminal 14. As chip area increases with addition of input/output terminals 14, cost is increased accordingly. Thus, a decrease in input/output terminals of chips is needed to lower cost.

BRIEF SUMMARY OF THE INVENTION

A detailed description is given in the following embodiments with reference to the accompanying drawings.

Embodiment of a control module is provided. The control module includes a plurality of switching elements and a control chip. Each switching element is coupled to a power terminal through a corresponding resistor, wherein the resistances of the corresponding resistors or an equivalent resistance of a combination thereof are different, and the switching elements generate an input current according to an operating condition thereof. A control chip includes an input/output terminal coupled to the switching elements and an identification unit to identify the operating conditions of the switching elements according to the input current, such that the control chip executes a corresponding logic operation.

The invention also provides a control chip, in which an input/output terminal is coupled to a plurality of switching elements, and an identification unit identifies operating conditions of the switching elements according to an input current from the switching elements, such that the control chip executes a corresponding logic operation. The identification unit includes a current-to-voltage conversion unit generating a corresponding voltage according to the input current, an analog-to-digital converter generating a corresponding digital value according to the corresponding voltage, and a comparison unit obtaining the operating conditions of the switching elements according to the corresponding digital value and a lookup table.

The invention provides a method for identifying operating conditions of switching elements by a single terminal, in which an input current is received, a corresponding voltage is generated according the input current, a corresponding digital value is generated according to the corresponding voltage, and the corresponding digital value and a lookup table are compared to obtain the operating conditions of the switching elements, wherein the switching elements are coupled to the single terminal receiving the input current.

BRIEF DESCRIPTION OF THE DRAWINGS

The invention can be more fully understood by reading the subsequent detailed description and examples with references made to the accompanying drawings, wherein:

FIG. 3 shows a relationship between digital values and voltage;

FIG. 4 is a lookup table showing the relationship between digital values and operating conditions of switching elements.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
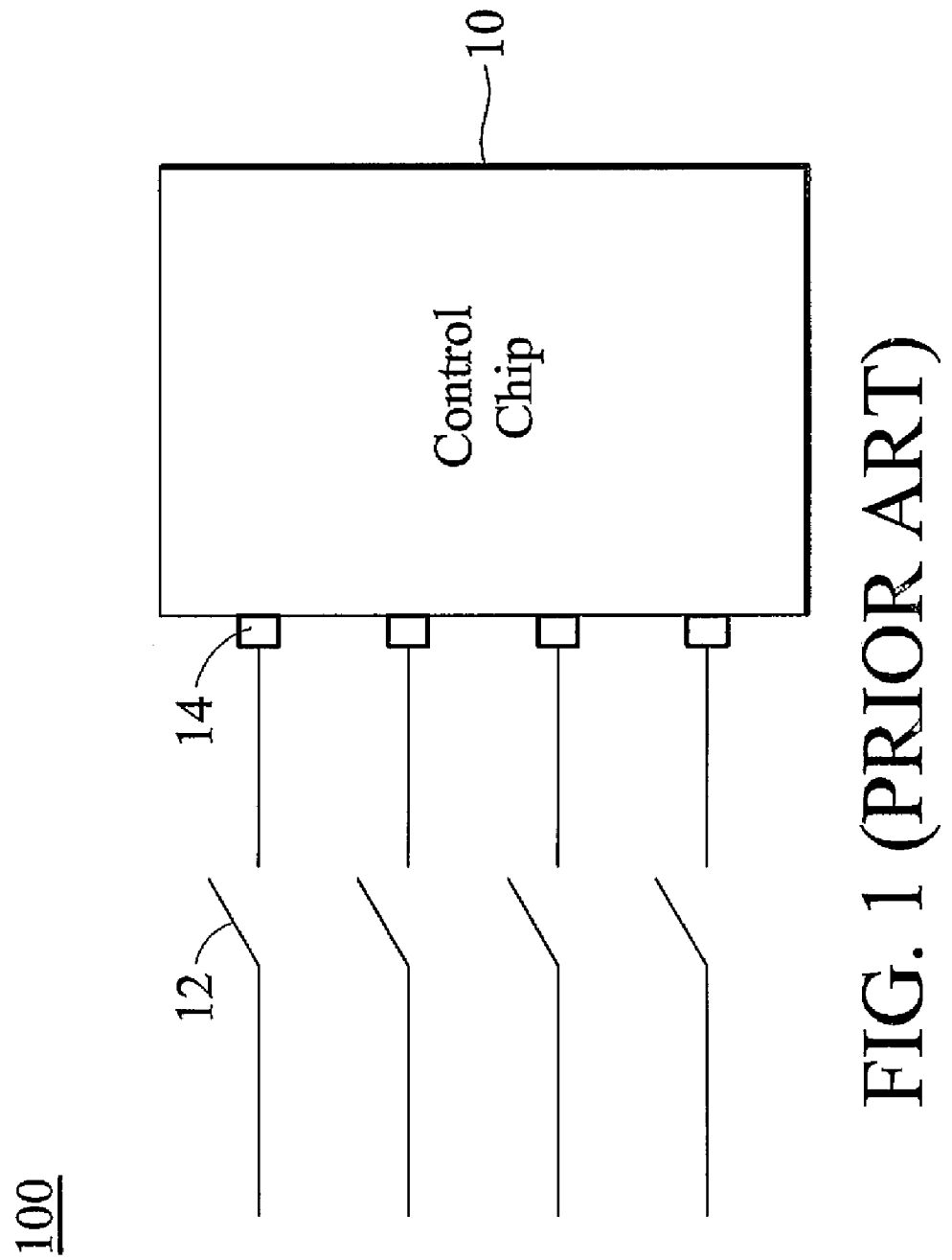
FIG. 1 shows a conventional control panel.
Figure 2:
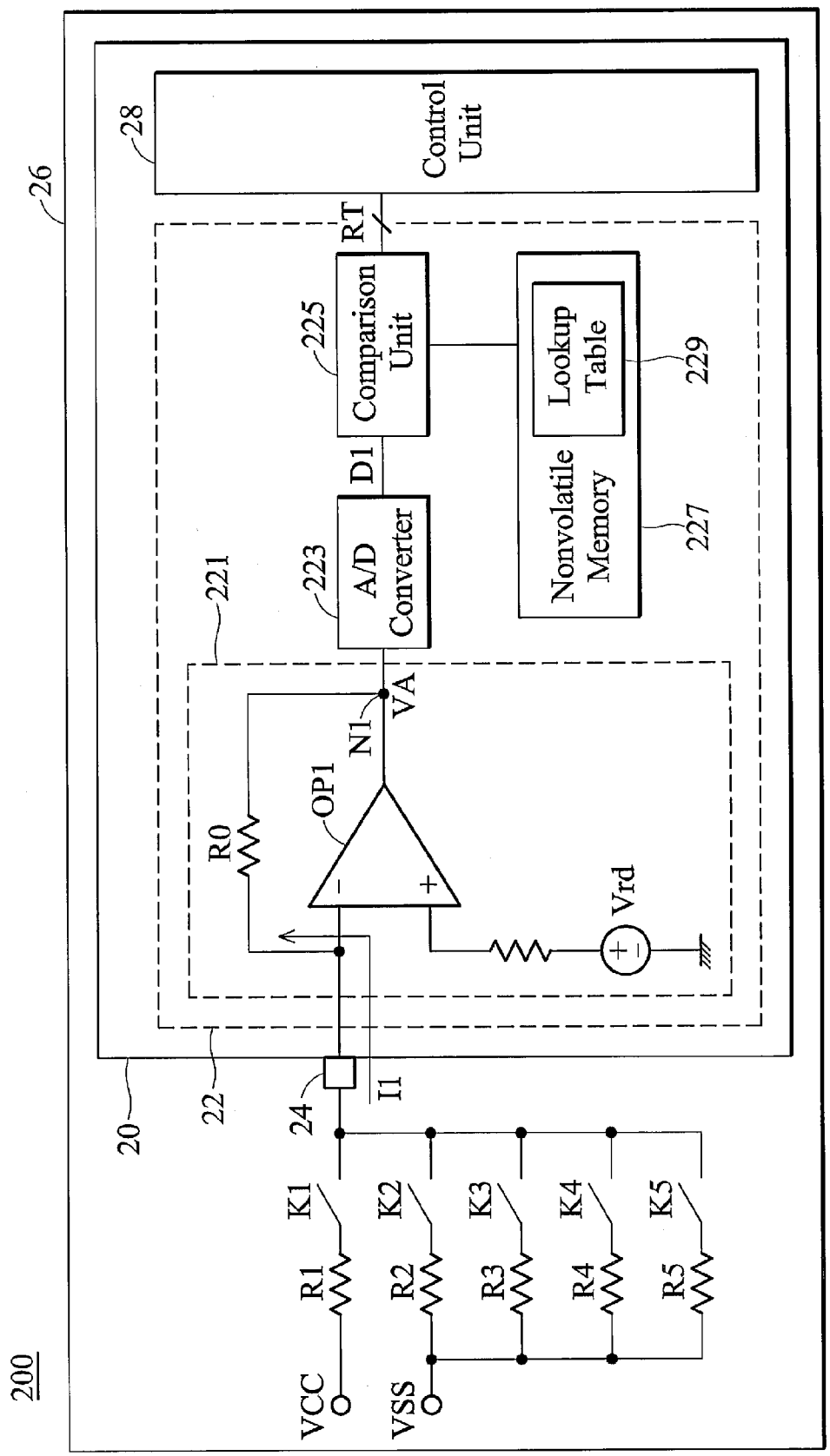
FIG. 2 shows an embodiment of a control module of the invention.

FIG. 2 shows an embodiment of a control module of the invention. As shown, the control module 200 includes a plurality of switching elements K1~K5, resistors R1~R5 and a control chip 20 disposed on a printed circuit board 26. For example, the control module 200 can be a control circuit (panel) of an optical disk player, a MP3 player, a digital camera, a DVD player, a display monitor, a television, a PDA, a mobile phone, or a notebook computer.

Switching elements K1~K5 are coupled to a single terminal (pin) 24 of the control chip 20, and switching element K1 is coupled to a power terminal VCC through resistor R1, switching element K2 is coupled to a power terminal VSS through resistor R2, switching element K3 is coupled to power terminal VSS through resistor R3, switching element K4 is coupled to power terminal VSS through resistor R4, and switching element K5 is coupled to power terminal VSS through resistor R5. It should be noted that the resistances of the resistors R1~R4 or an equivalent resistance of a combination thereof are different. For example, ratio of resistances of the resistors R1~R4 can be 1:2:4:8, 1:3:9:27, or 1:4:16:64 and the like. Namely, the resistances of the resistors R1~R4 and an equivalent resistance of a combination thereof each is unique. Correspondingly, an input current I1 is generated and input to the control chip 20 through the single terminal 24 when one or more switching elements are turned on. Because the resistances of the resistors R1~R4 and an equivalent resistance of a combination thereof each is unique, the input current input I1 to the control chip 20 is different due to different operating conditions of the switching elements. In the embodiment, the resistances of the resistors R4 and R5 are the same. In the embodiment, the single terminal 24 is an input/output terminal of the control chip 20.

The control chip 20 includes an identification unit 22 identifying the operating conditions of the switching elements according to the input current I1. The identification unit 22 includes a current-to-voltage conversion unit 221, an analog-to-digital converter 223, a comparison unit 225 and a nonvolatile memory 227. The current-to-voltage conversion unit 221 generates a corresponding voltage VA according to the input current I1. As shown in FIG. 2, the current-to-voltage conversion unit 221 includes an operational amplifier OP1 having a non-inverse input terminal coupled to a reference voltage Vrd, such as 1.5V, and an inverse input terminal coupled to an output terminal (such as node N1) thereof through a resistor R0. The input current I1 is input to the inverse input terminal of the operational amplifier OP1, and a voltage drop is generated across the resistor R0, such that the voltage VA on the node N1 can be regarded as Vrd−I1×R0 or Vrd+I1×R0. The voltage VA on the node N1 can be different because the input current I1 input to the control chip 20 is different due to different operating conditions of the switching elements.

The analog-to-digital converter 223 generates a corresponding digital value D1 according to the corresponding voltage VA. FIG. 3 shows a relationship between the different voltages VA and the corresponding digital values D1. As shown in FIG. 3, the voltage VA on the node N1 can be different because the input current I1 input to the control chip 20 is different and thus, the corresponding digital value D1 is different. The comparison unit 225 obtains the operating conditions of the switching elements K1~K5 according to the corresponding digital value D1 and a lookup table 229 stored in the nonvolatile memory 227 and outputs a result signal RT to the control unit 28 such that the control unit 28 executes a corresponding logic operation. For example, when the control module 200 is applied in an optical disc player, the control unit 28 controls a servo system (not shown) to open disc tray when the switching element K1, indicating ejection of the optical disc, is turned on. Alternately, the control unit 28 controls a disc drive (not shown) to play the optical disc when the switching element K4, indicating play of the optical disc, is turned on. In the embodiments, the nonvolatile memory 227 is a mask read only memory (ROM), a programmable ROM (PROM), an erasable programmable ROM (EPROM), an electrically erasable programmable ROM (EEPROM), a flash memory, or the like.

The switching element K5 is used to calibrate resistor R0 of the current-to-voltage conversion unit 221 and the reference voltage Vrd in the control chip 20, and the switching element K5 is turned off when the control chip 20 functions normally. During calibration, all the switching elements K1~K5 are turned off, and the voltage VA on the node N1 can be regarded as the actual voltage value of the reference voltage Vrd because there is no current though the resistor R0. Next, the switching element K5 is turned on, and actual resistance of the resistor R0 can be obtained based on the ratio of currents through the resistors R0 and R5. Those voltages VA under different operating conditions of the switching elements are converted to digital values D1, to form a relationship 40 as shown in FIG. 3. Further, different digital values D1 and corresponding operating conditions of the switching elements form a lookup table 229 (as shown in FIG. 4) stored in the nonvolatile memory 227.

Thus, the control module 200 of the embodiment can identify the operating conditions of the switching elements and execute different logic operations, based on an input current I1 from the switching elements K1~K4 through a single terminal (pin) 24. Namely, the switching elements in the embodiment have no need to connect to corresponding input/output terminals one by one, and the number of pins and chip area required by the control chip can be reduced with lowered cost accordingly.

Figure 5:
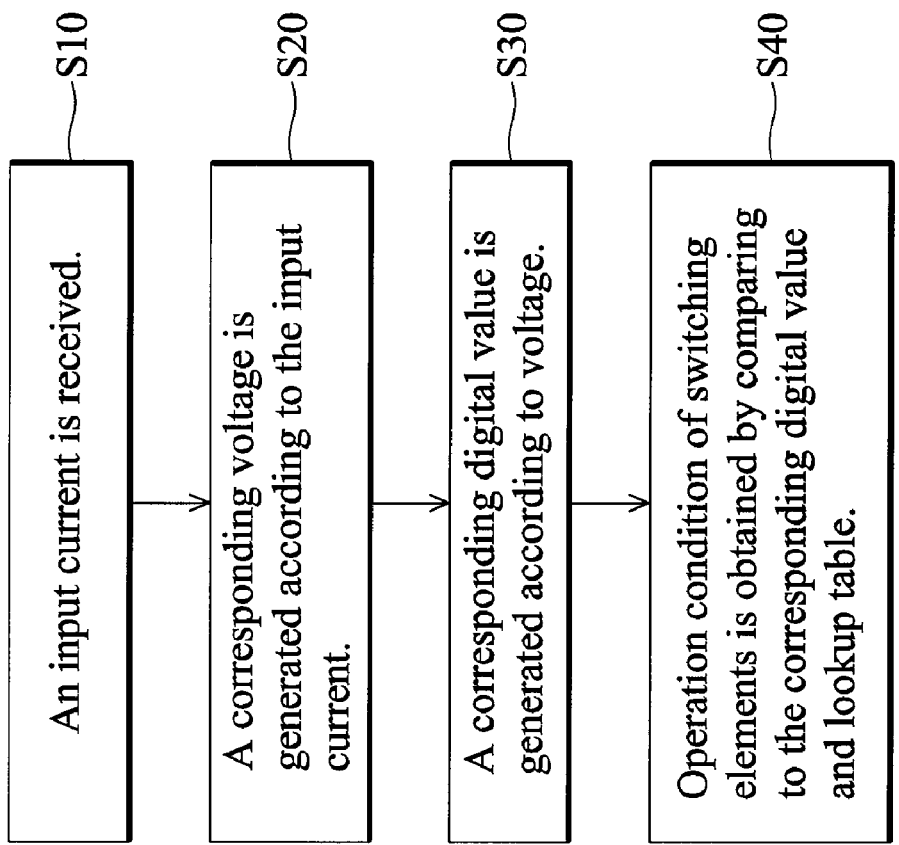
FIG. 5 is a flowchart of a method for identification of operating conditions of switching elements.

FIG. 5 is a flowchart of a method for identification of operating conditions of switching elements by a single terminal, including the following steps.

In step S10, receiving an input current.

In step S20, generating a corresponding voltage according to the input current.

In step S30, generating a corresponding digital value according to the corresponding voltage.

In step S40, obtaining operating conditions of switching elements by comparing the corresponding digital value to a lookup table.

Thus, the identifying method of the embodiment can identify operating conditions of the switching elements which are connected to the same input/output terminal (pin). Correspondingly, switching elements in the embodiment have no need to connect to corresponding input/output terminals of a control chip one by one, and the number of pins and chip area required by the control chip can be reduced with lowered cost accordingly.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded with the broadest interpretation so as to encompass all such modifications and similar arrangements.

What is claimed is:

1. A control module, comprising:
   a plurality of switching elements, each coupled to a power terminal through a corresponding resistor, wherein the resistances of the corresponding resistors or an equivalent resistance of a combination thereof are different, and the switching elements generate an input current according to an operating condition thereof; and
   a control chip, comprising an input/output terminal coupled to the switching elements and an identification unit identifying the operating conditions of the switching elements according to the input current, such that the control chip executes a corresponding logic operation.

2. The control module as claimed in claim 1, wherein the switching elements and the corresponding resistors are disposed on a printed circuit board.

3. The control module as claimed in claim 1, wherein the identification unit comprises:
   a current-to-voltage conversion unit generating a corresponding voltage according to the input current;
   an analog-to-digital converter generating a corresponding digital value according to the corresponding voltage; and
   a comparison unit obtaining the operating condition of the switching elements according to the corresponding digital value and a lookup table, such that the control chip executes a corresponding logic operation.

4. The control module as claimed in claim 3, wherein the current-to-voltage conversion unit comprises:
   an operational amplifier comprising a non-inverse input terminal coupled to a reference voltage, an inverse input terminal coupled to the switching elements through the input/output terminal, and an output terminal coupled to the analog-to-digital converter; and
   a first resistor coupled between the inverse input terminal and the output terminal of the operational amplifier.

5. The control module as claimed in claim 3, wherein the identification unit further comprises a nonvolatile memory storing the lookup table.

6. The control module as claimed in claim 5, wherein the nonvolatile memory is a mask read only memory (ROM), a programmable ROM, an erasable programmable ROM, an electrically erasable programmable ROM or a flash memory.

7. The control module as claimed in claim 1, wherein the control chip is a control chip of an optical disk player, a MP3 player, a digital camera, a DVD player, a display monitor, a television, a PDA, a mobile phone, or a notebook computer.

8. A control chip, comprising:
   an input/output terminal coupled to a plurality of switching elements; and
   an identification unit identifying operating conditions of the switching elements according to an input current from the switching elements, such that the control chip executes a corresponding logic operation, wherein the identification unit comprises:
      a current-to-voltage conversion unit generating a corresponding voltage according to the input current;
      an analog-to-digital converter generating a corresponding digital value according to the corresponding voltage; and
      a comparison unit obtaining the operating conditions of the switching elements according to the corresponding digital value and a lookup table.

9. The control chip as claimed in claim 8, wherein the switching elements are disposed on a printed circuit board, the switching elements are each coupled to a power terminal through a corresponding resistor, the resistances of the corresponding resistors or an equivalent resistance of a combination thereof are different, and the switching elements generate the input current according to operating conditions thereof.

10. The control chip as claimed in claim 8, wherein the current-to-voltage conversion unit comprises:
   an operational amplifier comprising a non-inverse input terminal coupled to a reference voltage, an inverse input terminal coupled to the switching elements through the input/output terminal, and an output terminal coupled to the analog-to-digital converter; and
   a first resistor coupled between the inverse input terminal and the output terminal of the operational amplifier.

11. The control chip as claimed in claim 8, wherein the identification unit further comprises a nonvolatile memory storing the lookup table.

12. The control chip as claimed in claim 11, wherein the nonvolatile memory is a mask read only memory (ROM), a programmable ROM, an erasable programmable ROM, an electrically erasable programmable ROM or a flash memory.

13. The control chip as claimed in claim 8, wherein the control chip is a control chip of a consumer electronic device.

14. The control chip as claimed in claim 13, wherein control chip is a control chip of an optical disk player, a MP3 player, a digital camera, a DVD player, a display monitor, a television, a PDA, a mobile phone, or a notebook computer.

15. A method for identifying operating conditions of switching elements by a single terminal, comprising:
   receiving an input current;
   generating a corresponding voltage according to the input current;
   generating a corresponding digital value according to the corresponding voltage; and
   obtaining the operating conditions of the switching elements by comparing the corresponding digital value to a lookup table, wherein the switching elements are coupled to the single terminal receiving the input current.

16. The method as claimed in claim 15, wherein the input current is input from the switching elements on a printed circuit board, the switching elements are each coupled to a power terminal through a corresponding resistor, the resistances of the corresponding resistors or an equivalent resistance of combination thereof are different, and the switching elements generate the input current according to the operating conditions thereof.

* * * * *